United States Patent
Chen et al.

(10) Patent No.: US 12,103,789 B2
(45) Date of Patent: Oct. 1, 2024

(54) ELECTRONIC DEVICE PICK-AND-PLACE SYSTEM AND ELECTRONIC DEVICE TESTING APPARATUS HAVING THE SAME

(71) Applicant: CHROMA ATE INC., Taoyuan (TW)

(72) Inventors: Chien-Ming Chen, Taoyuan (TW); Jui-Hsiung Chen, Taoyuan (TW); Yi-Sheng Xu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 221 days.

(21) Appl. No.: 17/816,086

(22) Filed: Jul. 29, 2022

(65) Prior Publication Data

US 2023/0086540 A1 Mar. 23, 2023

Related U.S. Application Data

(60) Provisional application No. 63/245,231, filed on Sep. 17, 2021.

(51) Int. Cl.
| | |
|---|---|
| *G01R 31/28* | (2006.01) |
| *B65G 47/90* | (2006.01) |
| *G01N 3/04* | (2006.01) |
| *H01L 21/67* | (2006.01) |
| *H01L 21/673* | (2006.01) |
| *H01L 21/683* | (2006.01) |
| *H05K 13/04* | (2006.01) |

(52) U.S. Cl.
CPC ............ *B65G 47/905* (2013.01); *G01N 3/04* (2013.01); *G01R 31/2867* (2013.01); *G01R 31/2874* (2013.01); *G01R 31/2887* (2013.01); *G01R 31/2893* (2013.01); *H01L 21/67236* (2013.01); *H01L 21/67333* (2013.01); *H01L 21/6838* (2013.01); *H05K 13/0408* (2013.01)

(58) Field of Classification Search
CPC ........ G01R 31/02; G01R 31/26; G01R 31/28; G01R 31/31; G01R 31/2867; G01R 31/2874; G01R 31/2887; G01R 31/2893
See application file for complete search history.

(56) References Cited

U.S. PATENT DOCUMENTS

| | | | |
|---|---|---|---|
| 2016/0165771 A1* | 6/2016 | Nishiyama | H05K 13/041 414/752.1 |
| 2020/0114526 A1* | 4/2020 | Awada | H05K 13/0404 |
| 2020/0383251 A1* | 12/2020 | Ito | H05K 13/04 |

* cited by examiner

*Primary Examiner* — Neel D Shah
(74) *Attorney, Agent, or Firm* — McClure, Qualey & Rodack, LLP

(57) ABSTRACT

The present invention relates to an electronic device pick-and-place system and an electronic device testing apparatus having the same, comprising a plurality of pick-and-place heads, a plurality of negative pressure generators and an air pressure regulating valve. Each pick-and-place head has a pick-and-place port; the plurality of negative pressure generators are communicated with the plurality of pick-and-place ports of the plurality of pick-and-place heads respectively; an inlet end of the air pressure regulating valve is communicated with an air pressure source, and an outlet end of the air pressure regulating valve is communicated with the plurality of negative pressure generators; the air pressure regulating valve can be used to adjust the suction forces of the pick-and-place ports of the pick-and-place heads in a batch. Accordingly, the suction forces and blowing forces of the pick-and-place ports of the pick-and-place heads can be adjusted in a batch.

10 Claims, 3 Drawing Sheets

ELECTRONIC DEVICE PICK-AND-PLACE SYSTEM AND ELECTRONIC DEVICE TESTING APPARATUS HAVING THE SAME

BACKGROUND OF THE INVENTION

Field of the Invention

The present invention relates to an electronic device pick-and-place system and an electronic device testing apparatus having the same, in particular to an electronic device pick-and-place system which picks up an electronic device by means of a negative pressure and places the electronic device by canceling the negative pressure, as well as an electronic device testing apparatus having the same.

DESCRIPTION OF THE RELATED ART

A pick-and-place system functioning to handle electronic devices plays a very important role in a manufacture process and a test process of electronic devices. In order to avoid damage of electronic devices, most of the existing technologies adopt negative pressure for picking the electronic devices.

A testing apparatus is provided with a pick-and-place system typically having a plurality of suction nozzles for picking and placing a plurality of electronic devices in a batch. This facilitates batch transfer and batch testing. Conventionally, a vacuum generator is used to form negative pressure so that each suction nozzle has a suction force. In other words, each suction nozzle corresponds to one respective vacuum generator. Relevant prior art is disclosed in Taiwanese Utility Model Patent No. 565005 entitled "Griping and Placing Device".

However, when the suction force needs to be adjusted, for example, when the object to be tested is changed, it is necessary to manually adjust the vacuum generators one by one. In the case of a large amount of suction nozzles, adjusting vacuum generators one by one is time-consuming and labor-consuming.

As such, an electronic device pick-and-place system capable of adjusting the suction forces of the suction nozzles in a batch and of fine-tuning the suction nozzles individually, and an electronic device testing apparatus having such a system are highly expected in the industry.

SUMMARY OF THE INVENTION

The main object of the present invention is to provide an electronic device pick-and-place system and an electronic device testing apparatus having such a system, which are capable of adjusting the suction forces of all pick-and-place heads in a batch, and therefore, are convenient, time-saving and labor-saving.

In order to achieve the above object, the present invention provides an electronic device pick-and-place system, comprising a plurality of pick-and-place heads, a plurality of negative pressure generators and an air pressure regulating valve, wherein each pick-and-place head has a pick-and-place port; the plurality of negative pressure generators are communicated with the plurality of pick-and-place ports of the plurality of pick-and-place heads respectively; the air pressure regulating valve includes an inlet end communicated with an air pressure source and an outlet end communicated with the plurality of negative pressure generators; the air pressure regulating valve is capable of adjusting the suction forces of the plurality of pick-and-place ports of the plurality of pick-and-place heads in a batch.

Accordingly, in the present invention, the flow rate and pressure of air flowing into the negative pressure generators can be adjusted in a batch, that is, the suction forces of the pick-and-place ports of the pick-and-place heads can be adjusted in a batch by arranging the air pressure regulating valve between the negative pressure generators and the air pressure source. In the case that all of the negative pressure generators are set to have the same vacuum degree, the suction forces of the pick-and-place ports of the pick-and-place heads can be adjusted in a batch.

Additionally, each negative pressure generator includes a first air flow inlet, a second air flow inlet, a pick-and-place head connection port and an air flow outlet; one end of the first air flow inlet may be communicated with the outlet end of the air pressure regulating valve, and the other end of the first air flow inlet may be communicated with the pick-and-place head connection port; one end of the second air flow inlet may be communicated with the outlet end of the air pressure regulating valve, and the other end of the second air flow inlet may be communicated with the air flow outlet and the pick-and-place head connection port; the pick-and-place head connection port may be communicated with the pick-and-place port of one of the plurality of pick-and-place heads. When an air flow of the air pressure source flows into the negative pressure generator from the first air flow inlet, the air flow may flow through the pick-and-place head connection port and the pick-and-place port and form a blowing air flow. When the air flow of the air pressure source flows into the negative pressure generator from the second air flow inlet, the air flow may flow out from the air flow outlet so that a negative pressure is formed at the pick-and-place head connection port and the pick-and-place port.

Preferably, each negative pressure generator includes a vacuum degree adjusting knob for adjustment of a negative pressure effect. Each vacuum degree adjusting knob may have the same adjustment amount. In other words, the negative pressure generators of the present invention may be adjustable negative pressure generators so that not only the vacuum degrees of the negative pressure generators can be adjusted to be consistent in advance, but also the vacuum degrees of the negative pressure generators can be fine-tuned individually.

More preferably, each pick-and-place head includes a hollow tube and a tapered cover, wherein one end of the hollow tube may be communicated with one of the plurality of negative pressure generators, the tapered cover is fitted on the other end of the hollow tube, and a tip of the tapered cover is formed with the pick-and-place port. Each pick-and-place head may further include a leak-proof ring, which is fitted on the hollow tube and is interposed between an inner circumferential surface of the tapered cover and an outer circumferential surface of the hollow tube. A positioning pin is provided on the hollow tube of each pick-and-place head, and a notch is formed on the tapered cover of each pick-and-place head. When the tapered cover is fitted on the other end of the hollow tube, the positioning pin may be engaged with the notch.

According to the electronic device pick-and-place system of the present invention, the air pressure regulating valve may be a pressure reducing valve, an electronic proportional valve or other equivalent devices which is capable of adjusting the pressure or the flow rate of the air pressure source. Moreover, the electronic device pick-and-place system of the present invention may further comprise a control unit, wherein the air pressure regulating valve is electrically connected to the control unit so that the air pressure regulating valve can be adjusted by the control unit such as a computer.

In order to achieve the above object, the present invention provides an electronic device testing apparatus, comprising a test socket, a pressing head and the above electronic device pick-and-place system, wherein the test socket includes a plurality of chip slots; the pressing head is located above the test socket and capable of being selectively lowered toward or raised away from the test socket.

DESCRIPTION OF THE PREFERRED EMBODIMENTS

Figure 1:
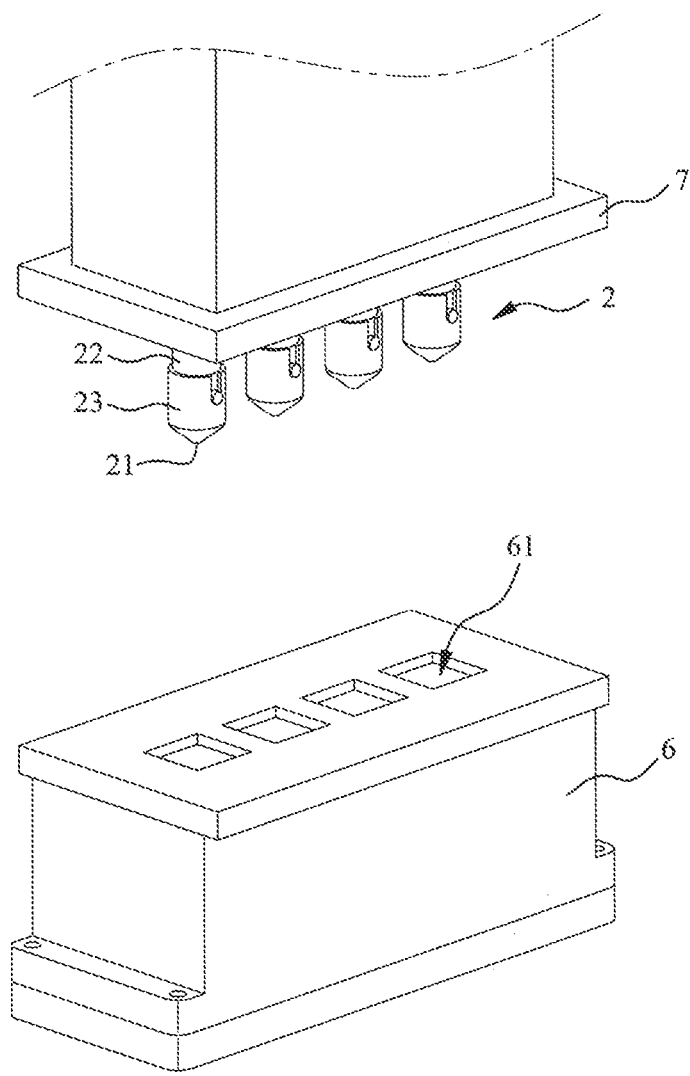
FIG. 1 is a perspective view of a preferred embodiment of an electronic device testing apparatus of the present invention.

Before an electronic device pick-and-place system and an electronic device testing apparatus having the same according to the present invention are described in detail in the embodiments, it should be noted that in the following description, similar components will be designated by the same reference numerals. Furthermore, the drawings of the present invention are for illustrative purposes only, they are not necessarily drawn to scale, and not all details are necessarily shown in the drawings.

Reference is made to FIG. 1, which is a perspective view of a preferred embodiment of an electronic device testing apparatus of the present invention. This figure shows a test socket 6 and a pressing head 7. Four chip slots 61 are provided on the upper surface of the test socket 6. It is noted that the number of the chip slots 61 is not limited to four and may be one or more. The pressing head 7 is located above the test socket 6 and can be controlled to be selectively lowered toward or raised away from the test socket 6. Four pick-and-place heads 2 are disposed on the lower surface of the pressing head 7, and a plurality pick-and-place ports 21 of each pick-and-place head 2 corresponds to a plurality of chip slots 61 of the test socket 6. The pick-and-place heads 2 can pick up chips (not shown in the figure) and place them in the chip slots 61 by means of the pick-and-place ports 21 so that the chips are tested. When the test is completed, the chips can be picked up by the pick-and-place ports 21 of the pick-and-place heads 2 and moved away.

Figure 2:
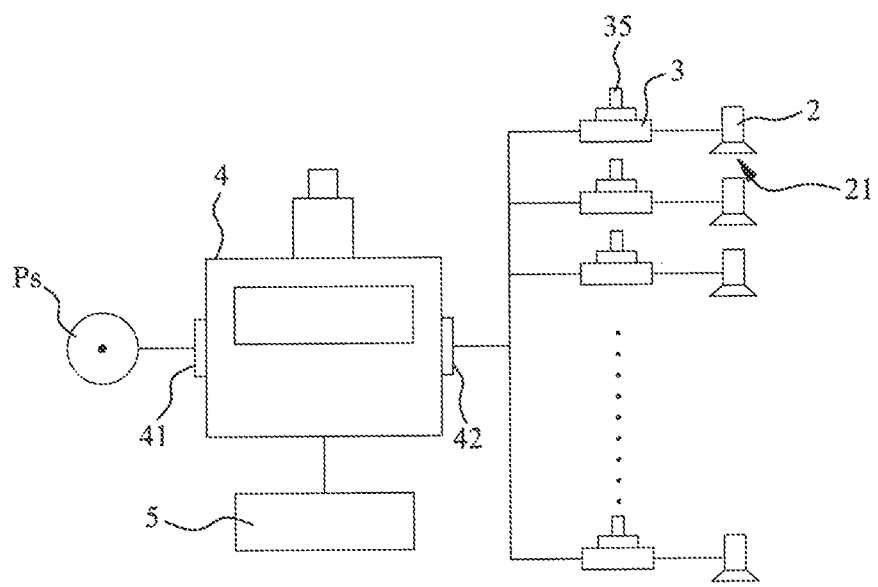
FIG. 2 is a schematic view of a preferred embodiment of an electronic device pick-and-place system of the present invention.

Reference is made to FIG. 2, which is a schematic view of a preferred embodiment of an electronic device pick-and-place system of the present invention. As shown in this figure, the electronic device pick-and-place system of the present embodiment mainly includes a plurality of pick-and-place heads 2, a plurality of negative pressure generators 3, an air pressure regulating valve 4 and a control unit 5. The number of the pick-and-place heads 2 is the same with that of the negative pressure generators 3. Each pick-and-place head 2 is equipped with one negative pressure generator 3, and the pick-and-place port 21 of each pick-and-place head 2 is communicated with the one negative pressure generator 3. A negative pressure is formed by the negative pressure generator 3 so that a suction force can be generated at the pick-and-place port 21 of the pick-and-place head 2.

The air pressure regulating valve 4 includes an inlet end 41 communicated with an air pressure source Ps providing high-pressure air and an outlet end 42 communicated with the plurality of negative pressure generators 3. The high-pressure air provided by the air pressure source Ps flows into the negative pressure generators 3 through the air pressure regulating valve 4 so that negative pressure is formed by the negative pressure generators 3. The principle of formation of the negative pressure will be described in detail later.

Preferably, the air pressure regulating valve 4 of this embodiment may be an electronic proportional valve electrically connected to the control unit 5, and the control unit 5 may be an industrial computer, a desktop computer, a notebook computer, a tablet computer, a smartphone or other dedicated controllers. In other words, the user may operate the control unit 5 through the user operation interface for setting the pressure or flow rate of air output by the air pressure regulating valve 4. The present invention is not limited to the case that the setting value of the air pressure regulating valve 4 is adjusted by the control unit 5, but a general pressure reducing valve which is manually operated may be used in the present invention.

Figure 3:
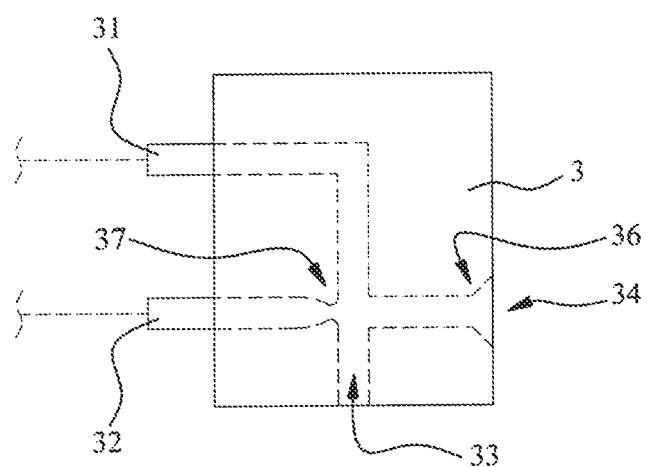
FIG. 3 is a schematic view of a preferred embodiment of a negative pressure generator of the present invention.

Reference is made to FIG. 2 and FIG. 3. FIG. 3 is a schematic view of a preferred embodiment of the negative pressure generator of the present invention. The operation principle of the negative pressure generator 3 of the present embodiment will be described below. As shown in the figure, the negative pressure generator 3 of this embodiment includes a first air flow inlet 31, a second air flow inlet 32, a pick-and-place head connection port 33 and an air flow outlet 34, wherein one end of the first air flow inlet 31 is communicated with the outlet end 42 of the air pressure regulating valve 4, and the other end of the first air flow inlet 31 is communicated with the pick-and-place head connection port 33; one end of the second air flow inlet 32 is communicated with the outlet end 42 of the air pressure regulating valve 4, and the other end of the second air flow inlet 32 is communicated with the air flow outlet 34 and the pick-and-place head connection port 33; and the pick-and-place head connection port 33 is used to be communicated with the pick-and-place port 21 of the pick-and-place head 2.

When the air flow from the air pressure source Ps flows through the air pressure regulating valve 4 and then flows into the negative pressure generator 3 from the first air flow inlet 31, the air flow flows through the pick-and-place head connection port 33 and the pick-and-place port 21 and forms a blowing air flow. On the other hand, when the air flow from the air pressure source Ps flows through the air pressure regulating valve 4 and then flows into the negative pressure generator 3 from the second air flow inlet 32, the air flow flows out from the air flow outlet 34. Since a nozzle 37 and a diffuser 36 are disposed between the second air flow inlet 32 and the air flow outlet 34, the compressed air can be converted into a high-speed jet flow. According to Bernoulli's principle, the air in the pick-and-place head connection port 33 would be taken away by the high-speed jet flow so that negative pressure is formed at the pick-and-place head connection port 33 to generate a suction force.

In general, the negative pressure generator 3 in this embodiment adopts a two-inlet-two-outlet configuration, wherein one positive pressure air flow directly forms a blowing air flow, and the other positive pressure air flow allow negative pressure generating a suction force to be formed in the pick-and-place head connection port 33. The advantage of the two-inlet-two-outlet configuration is that the blowing force and the suction force would not affect each other. As shown in FIG. 2, the negative pressure generator 3 of the present embodiment further includes a vacuum degree adjusting knob 35 for adjustment of the negative pressure effect generated by the negative pressure generator 3, for example, for adjustment of the flow rate, the open degree of the nozzle 37 or the open degree of the diffuser 36. In this embodiment, each vacuum degree adjusting knob 35 has the same adjustment amount for uniformly adjusting the suction force. Of course, some of the negative pressure generators 3 may be fine-tuned individually.

Figure 4A:
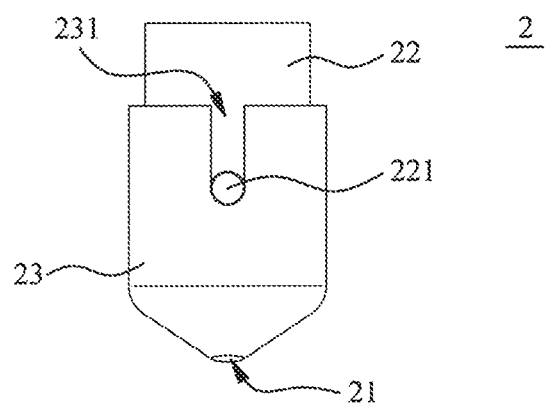
FIG. 4A is a front view of a preferred embodiment of a pick-and-place head of the present invention.
Figure 4B:
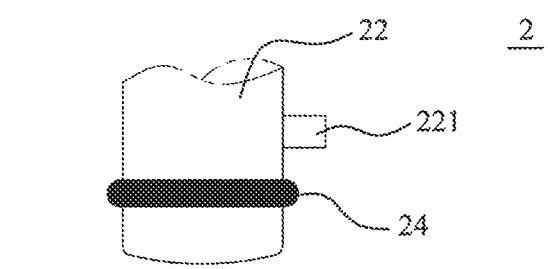
FIG. 4B is an exploded left side view of a preferred embodiment of the pick-and-place head of the present invention.
Figure 4B:
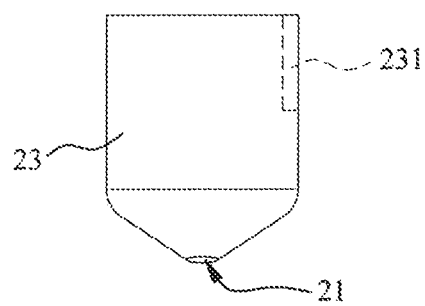
Figure 4C:
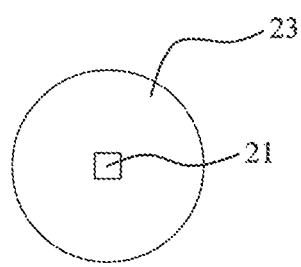
FIG. 4C is a bottom view of a preferred embodiment of the pick-and-place head of the present invention.

Reference is made to FIGS. 4A, 4B and 4C. FIG. 4A is a front view of a preferred embodiment of the pick-and-place head of the present invention, FIG. 4B is an exploded left side view of a preferred embodiment of the pick-and-place head of the present invention, and FIG. 4C is a bottom view of a preferred embodiment of the pick-and-place head of the present invention. In this embodiment, each pick-and-place head 2 includes a hollow tube 22 and a tapered cover 23, wherein one end of the hollow tube 22 is communicated with the negative pressure generator 3 (see FIG. 2), the tapered cover 23 is fitted on the other end of the hollow tube 22, and the tip of the tapered cover is formed with the pick-and-place port 21.

As shown in FIG. 4B, each pick-and-place head 2 further includes a leak-proof ring 24 (an O-ring in this embodiment), which is fitted on the hollow tube 22 and is interposed between the inner circumferential surface of the tapered cover 23 and the outer circumferential surface of the hollow tube 22. When the tapered cover 23 is to be fitted on the hollow tube 22, the leak-proof ring 24 produces an interference effect so that the tapered cover 23 can be tightly fitted on the hollow tube 22, so as to prevent the tapered cover 23 from falling off. On the other hand, in the case that the tapered cover 23 is to be detached from the hollow tube 22, the tapered cover 23 is pulled downwardly with a slight force to overcome the interference force of the leak-proof ring 24 so that the hollow tube 22 and the tapered cover 23 are easily separated. Accordingly, the present invention provides a quick-release pick-and-place head 2, which is quite fast and convenient for replacement or attachment.

In this embodiment, a positioning pin 221 is provided on the hollow tube 22 of the pick-and-place head 2, and a notch 231 open upward is formed on the tapered cover 23. When the tapered cover 23 is fitted on the other end of the hollow tube 22, the positioning pin 221 can be engaged with the notch 231 so that the orientation of the tapered cover 23 is maintained. The arrangement of the positioning pin 221 and the notch 231 is particularly suitable for the case that the orientation in which chips are picked and placed has to be specially set, for example, a square pick-and-place port 21 as shown in FIG. 4C.

Generally, the present embodiment avoids the inconvenience caused by the fact that the negative pressure generators need to be adjusted one by one for the purpose of adjustment of the suction force in the prior art, and the present embodiment can adjust the suction forces and blowing forces of the pick-and-place heads in a batch by using the air pressure regulating valve. If necessary, the negative pressure generators may be adjusted individually. In addition, the negative pressure generator of this embodiment adopts the two-inlet-two-outlet configuration so that the blowing force and the suction force would not affect each other. Furthermore, the pick-and-place head in this embodiment is quick-release and convenient for replacement or attachment. Moreover, the pick-and-place head of this embodiment is designed with the positioning pin and the notch, which are particularly beneficial to maintain the orientation of the pick-and-place head and is especially suitable for the case that the orientation in which chips are picked and placed has to be specially set.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. An electronic device pick-and-place system, comprising:
    a plurality of pick-and-place heads, including a plurality of pick-and-place ports;
    a plurality of negative pressure generators, communicated with the plurality of pick-and-place ports of the plurality of pick-and-place heads respectively; and
    an air pressure regulating valve, including an inlet end and an outlet end, the inlet end communicated with an air pressure source, and the outlet end communicated with the plurality of negative pressure generators,
    wherein high-pressure air from the air pressure source flows into the plurality of negative pressure generators through the air pressure regulating valve, thereby generating negative pressure within the plurality of negative pressure generators; the air pressure regulating valve is used to adjust suction forces of the plurality of pick-and-place ports of the plurality of pick-and-place heads in a batch.

2. The electronic device pick-and-place system of claim 1, wherein each negative pressure generator includes a first air flow inlet, a second air flow inlet, a pick-and-place head connection port and an air flow outlet; one end of the first air flow inlet is communicated with the outlet end of the air pressure regulating valve, and the other end of the first air flow inlet is communicated with the pick-and-place head connection port; one end of the second air flow inlet is communicated with the outlet end of the air pressure regulating valve, and the other end of the second air flow inlet is communicated with the air flow outlet and the pick-and-place head connection port; and the pick-and-place head connection port is communicated with the pick-and-place port of one of the plurality of pick-and-place heads.

3. The electronic device pick-and-place system of claim 2, wherein when an air flow of the air pressure source flows into the negative pressure generator from the first air flow inlet, the air flow flows through the pick-and-place head connection port and the pick-and-place port and forms a blowing air flow; when the air flow of the air pressure source flows into the negative pressure generator from the second air flow inlet, the air flow flows out from the air flow outlet so that a negative pressure is formed at the pick-and-place head connection port and the pick-and-place port.

4. The electronic device pick-and-place system of claim 1, wherein each negative pressure generator includes a vacuum degree adjusting knob for adjustment of a negative pressure effect; and each vacuum degree adjusting knob has the same adjustment amount.

5. The electronic device pick-and-place system of claim 1, wherein each pick-and-place head includes a hollow tube and a tapered cover, one end of the hollow tube is communicated with one of the plurality of negative pressure generators, and the tapered cover is fitted on the other end of the hollow tube; and a tip of the tapered cover is formed with the pick-and-place port.

6. The electronic device pick-and-place system of claim 5, wherein each pick-and-place head further includes a leak-proof ring, which is fitted on the hollow tube and is interposed between an inner circumferential surface of the tapered cover and an outer circumferential surface of the hollow tube.

7. The electronic device pick-and-place system of claim 5, wherein a positioning pin is provided on the hollow tube of each pick-and-place head, and a notch is formed on the tapered cover of each pick-and-place head; and when the tapered cover is fitted on the other end of the hollow tube, the positioning pin is engaged with the notch.

8. The electronic device pick-and-place system of claim 1, wherein the air pressure regulating valve is a pressure reducing valve or an electronic proportional valve.

9. The electronic device pick-and-place system of claim 1, further comprising a control unit, wherein the air pressure regulating valve is electrically connected to the control unit.

10. An electronic device testing apparatus, comprising:
a test socket, including a plurality of chip slots;
a pressing head, located above the test socket and capable of being selectively lowered toward or raised away from the test socket; and
the electronic device pick-and-place system of claim 1, wherein the plurality of pick-and-place heads are provided on a lower surface of the pressing head, and the pick-and-place ports of the plurality of pick-and-place heads correspond to the plurality of chip slots of the test socket.

* * * * *